(12) United States Patent
Kimura et al.

(10) Patent No.: US 9,384,875 B2
(45) Date of Patent: Jul. 5, 2016

(54) METHOD FOR TRANSFERRING GRAPHENE FILM AND METHOD FOR MANUFACTURING TRANSPARENT CONDUCTIVE FILM

(75) Inventors: Nozomi Kimura, Kanagawa (JP); Keisuke Shimizu, Kanagawa (JP); Toshio Fukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 386 days.

(21) Appl. No.: 13/992,308

(22) PCT Filed: Dec. 14, 2011

(86) PCT No.: PCT/JP2011/006963
§ 371 (c)(1),
(2), (4) Date: Jun. 7, 2013

(87) PCT Pub. No.: WO2012/093443
PCT Pub. Date: Jul. 12, 2012

(65) Prior Publication Data
US 2013/0264009 A1  Oct. 10, 2013

(30) Foreign Application Priority Data
Jan. 5, 2011 (JP) .................................. 2011-000379

(51) Int. Cl.
*B32B 37/12* (2006.01)
*C01B 31/04* (2006.01)
(Continued)

(52) U.S. Cl.
CPC ............ *H01B 13/0036* (2013.01); *B82Y 30/00* (2013.01); *B82Y 40/00* (2013.01);
(Continued)

(58) Field of Classification Search
CPC ............ H01B 13/0036; H01G 9/2031; H01G 9/2059; H01L 51/442; B32B 37/025; B82Y 30/00; B82Y 40/00; Y10T 156/1702; C01B 31/0453; C01B 31/0484; C01B 31/0438; C01B 31/0446
USPC ............................... 156/241, 247, 307.3, 325
See application file for complete search history.

(56) References Cited

U.S. PATENT DOCUMENTS

| | | | |
|---|---|---|---|
| 2012/0270054 A1* | 10/2012 | Hong | B29B 15/08 428/408 |
| 2012/0282419 A1* | 11/2012 | Ahn | B82Y 30/00 428/34.8 |
| 2013/0233480 A1* | 9/2013 | Na | B32B 37/025 156/249 |

FOREIGN PATENT DOCUMENTS

| | | |
|---|---|---|
| EP | 2179963 A1 | 4/2010 |
| JP | 2009-062247 A | 3/2009 |
| JP | 2009-298683 A | 12/2009 |

OTHER PUBLICATIONS

Office Action for CN201180063524.X.*
(Continued)

*Primary Examiner* — Sonya Mazumdar
(74) *Attorney, Agent, or Firm* — Chip Law Group (57) ABSTRACT

[Object] To provide a method for transferring a graphene film, which can transfer a graphene film on a desired substrate with excellent adhesiveness, can effectively prevent defects from being generated in a graphene film and is excellent also in mass productivity, and a method for manufacturing a transparent conductive film.
[Solving Means] One layer or a plurality of layers of graphene films 12 formed on a first substrate 11 and a second substrate 14 are stuck with a resin layer 13 that contains less than 1% by weight of a volatile component and has adhesiveness, the first substrate 11 and the second substrate 14 are pressurized to reduce a thickness of the resin layer 13, the resin layer 13 is cured, after that the first substrate 11 is removed.

18 Claims, 3 Drawing Sheets

(51) Int. Cl.
  *B82Y 40/00*   (2011.01)
  *H01B 13/00*   (2006.01)
  *B82Y 30/00*   (2011.01)
  B32B 38/10     (2006.01)
  B32B 37/00     (2006.01)
  H01G 9/20      (2006.01)
  H01L 51/44     (2006.01)

(52) U.S. Cl.
  CPC ........ *C01B 31/0438* (2013.01); *C01B 31/0446* (2013.01); *C01B 31/0453* (2013.01); *B32B 37/025* (2013.01); *H01G 9/2031* (2013.01); *H01G 9/2059* (2013.01); *H01L 51/442* (2013.01); *Y10T 156/1072* (2015.01); *Y10T 156/1702* (2015.01)

(56) References Cited

OTHER PUBLICATIONS

Bae et al., Roll-to-roll production of 30-inch graphene films for transparent electrodes. Nat Nanotechnol. Aug. 2010;5(8):574-8. doi: 10.1038/nnano.2010.132. Epub Jun. 20, 2010.

Juang et al., Graphene synthesis by chemical vapor deposition and transfer by a roll-to-roll process. Elsevier Carbon. May 2010; 48:3169-74.

Verma et al., Large-area graphene on polymer film for flexible and transparent anode in field emission device. Appl Phys Lett. Apr. 2010;96(20):203108-1-203108-3.

\* cited by examiner

METHOD FOR TRANSFERRING GRAPHENE FILM AND METHOD FOR MANUFACTURING TRANSPARENT CONDUCTIVE FILM

CROSS-REFERENCES TO RELATED APPLICATIONS

The present application is the national phase of International Application No. PCT/JP2011/006963, titled "METHOD FOR TRANSFERRING GRAPHENE FILM AND METHOD FOR MANUFACTURING TRANSPARENT CONDUCTIVE FILM," filed on Dec. 14, 2011, which claims the benefit of priority to Japanese Patent Application No. 2011-000379, titled "GRAPHENE FILM TRANSFER METHOD, AND METHOD FOR MANUFACTURING TRANSPARENT CONDUCTIVE FILM," filed with the Japanese Patent Office on Jan. 5, 2011. Each of these applications is hereby incorporated by reference in its entirety.

TECHNICAL FIELD

The present invention relates to a method for transferring a graphene film and a method for manufacturing a transparent conductive film, and can be preferably applied for manufacturing a transparent conductive film used for, for example, a display, a touch panel, a dye-sensitized solar battery, and so on.

BACKGROUND ART

Graphene configured of a monolayer of carbon atoms of graphite has high conductivity and is expected as a transparent conductive material and a wiring material. Above all, a graphene film synthesized by a thermal CVD method is gathering an attention because it can be formed into a large area film and the number of layers can be controlled.

According to a method for synthesizing a graphene film by a thermal CVD method, as a graphene film is formed on a metal catalyst substrate, it is necessary to transfer the graphene film from a metal catalyst substrate on a desired substrate.

As a conventional method for transferring a graphene film, a transferring method that uses polymethyl methacrylate (PMMA), a transferring method that uses a heat peeling tape and the like have been reported (see Non-Patent Document 1, for example).

Further, as another conventional method for transferring a graphene film, a method where a graphene sheet is formed on a carbonized catalyst film, a binder layer is formed on the graphene sheet, a substrate is adhered to the binder layer, these are immersed in a acid solution to remove the carbonized catalyst film has been proposed (see patent document 1). It is described that as a substance of the binder layer, commercially available siloxane compound, acryl compound and so on are used. However, these commercially available binder substances generally contain a volatile component configured of a solvent such as alcohol, acetal and so on by several percent by weight or more.

Patent Document 1: Japanese Patent Application Laid-open No. 2009-298683

Non-Patent Document 1: S. Bae et al., Nature Nanotechnology 5, 574 (2010)

SUMMARY OF INVENTION

Problem to be Solved by the Invention

However, a method for transferring a graphene film, which is described in Non-Patent Document 1, has the problem such that mass productivity is scarce and transparent conductivity is deteriorated by transferring, that is, impractical.

Further, according to a method for transferring a graphene film, which is described in Patent Document 1, in the step of curing a binder layer after a graphene film has been stuck, air bubbles generated owing to volatilization of a volatile component contained in the binder layer generate defects in the graphene film. Accordingly, it was difficult to obtain a graphene film having desirable characteristics (conductivity, barrier property, thermal conductivity and so on).

Accordingly, a problem that the invention is to solve is to provide a method for transferring a graphene film, which can transfer a graphene film on a desired substrate with excellent adhesiveness, can effectively prevent defects from being generated in the graphene film and is excellent also in mass productivity, and a method for manufacturing a transparent conductive film.

Means for Solving the Problem

In order to solve the problem, the present invention provides a transferring method of a graphene film, which includes the steps of:

sticking one layer or a plurality of layers of graphene films formed on a first substrate and a second substrate with a resin layer that contains less than 1% by weight of a volatile component and has adhesiveness; and removing the first substrate.

Further, the invention provides a method for manufacturing a transparent conductive film, which includes the step of:

sticking one layer or a plurality of layers of graphene films formed on a first substrate and a second substrate with a resin layer that contains less than 1% by weight of a volatile component and has adhesiveness; and removing the first substrate.

In the present invention, from the viewpoint of preventing defects from being generated in a graphene film to be transferred to improve a film quality, a content of a volatile component in a resin layer is preferably 0.5% by weight or less, more preferably 0.1% by weight or less. In a typical example, the present invention further includes, after sticking a graphene film formed on a first substrate and a second substrate with a resin layer and before removing the first substrate, the step of pressurizing the first substrate and the second substrate to reduce a thickness of the resin layer. Further, the present invention typically further includes, after the step of pressurizing the first substrate and the second substrate to reduce a thickness of the resin layer and before removing the first substrate, the step of curing the resin layer. A method for curing a resin layer is adequately selected according to a kind of the resin layer. For example, when a resin layer is configured of a UV-curable resin, the resin layer can be cured by irradiating UV rays, and when a resin layer is configured of a thermosetting resin, the resin layer can be cured by heating. In a typical example, on a graphene film formed on a first substrate, a resin layer that contains less than 1% by weight of a volatile component and has adhesiveness is coated. In another example, after coating a resin layer that contains 1% by weight or more of a volatile component and has adhesiveness on a graphene film formed on a first substrate, the resin layer is dried to remove a volatile component, thereby a resin layer that contains less than 1% by weight of a volatile component and has adhesiveness is formed. A resin layer that contains less than 1% by weight of a volatile component and has adhesiveness preferably has fluidity at room temperature but may have fluidity in a heated state, in the latter case, in a heated state, a graphene film formed on a first substrate and a second substrate are stuck.

A resin layer is typically configured of a UV-curable resin, a thermosetting resin or a thermoplastic resin, and selected from these according to necessity without limiting thereto. A first substrate and a second substrate are selected according to necessity. In particular, as a second substrate, according to use of a graphene film, a desired substrate is used.

A structure obtained by sticking a graphene film and a second substrate with a resin layer or a transparent conductive film can be used as a transparent conductive film or a transparent conductive sheet. A transparent conductive film can be used in various kinds of electronic devices. Specific examples of the electronic devices include displays such as a liquid crystal display (LCD), an organic electroluminescent display (organic EL display) and so on, a touch panel and so on, and applications of the transparent conductive film are not limited. A transparent conductive film can be used also as a transparent electrode for, for example, a solar battery, for example a dye-sensitized solar battery and so on.

In the invention configured as described above, a graphene film and a second substrate are stuck via a resin layer having adhesiveness, whereby a graphene film can be transferred with excellent adhesiveness with respect to a second substrate. Further, since a resin layer used for sticking contains less than 1% by weight of a volatile component, upon curing, there is hardly any generation of air bubbles owing to volatilization of the volatile component and there is hardly any generation of defects in a graphene film owing to air bubbles. Further, by removing the first substrate after sticking a graphene film formed on a first substrate and a second substrate with a resin layer, a graphene film can be readily transferred on the second substrate. Thus, mass productivity is excellent.

Effect of the Invention

According to the present invention, a method for transferring a graphene film and a method for manufacturing a transparent conductive film, according to which a graphene film can be transferred with excellent adhesiveness on a desired substrate, defects can be effectively prevented from being generated in the graphene film, and also mass productivity is excellent can be obtained.

MODES FOR CARRYING OUT THE INVENTION

Hereinafter, modes for carrying out the invention (hereinafter, referred to as "embodiments") will be described. The explanation will follow the following order.
1. First embodiment (method for transferring graphene film), and
2. Second embodiment (method for transferring graphene film)

1. First Embodiment

Method for Transferring Graphene Film

FIG. 1A to E show a method for transferring a graphene film according to a first embodiment.

Figure 1:
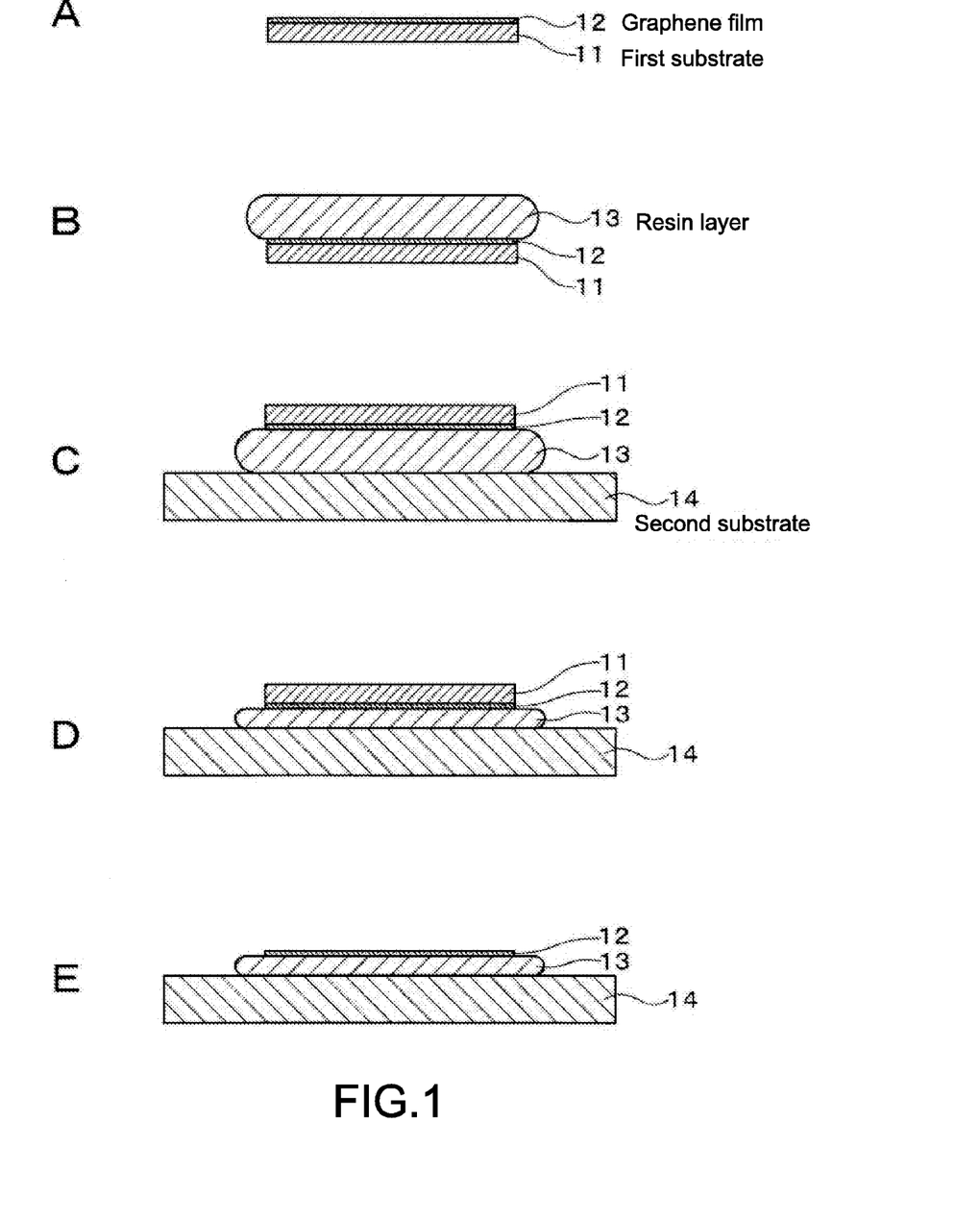
FIG. 1 A cross-sectional view for explaining a method for transferring a graphene film according to a first embodiment of the present invention.

As shown in FIG. 1A, on a first substrate 11, one layer or a plurality of layers of graphene films 12 is formed. As a first substrate 14, a substrate at least on a surface of which a metal catalyst made of copper or nickel is formed is used. For example, a substrate obtained by forming a nickel catalyst layer on a copper substrate or a silicon substrate is used without limiting thereto. Although a method for synthesizing a graphene film 12 is not particularly limited, a thermal CVD method can be preferably used.

Next, as shown in FIG. 1B, on the graphene film 12, a resin layer 13 that contains less than 1% by weight, preferably by 0.5% by weight or less, and more preferably by 0.1% by weight or less a volatile component, and has adhesiveness is coated. A thickness of the resin layer 13 is preferably selected in the range of 20 μm or less for example to make a surface of the resin layer 13 flat. Further, the thickness of the resin layer 13 is selected, in order to obtain an enough adhesion force, preferably in the range of, for example, 1 μm or more and more preferably in the range of 2 μm or more. The resin layer 13 preferably has a tack strength of, for example, 2 N/m or more at room temperature without particularly limiting thereto.

As a method for coating a resin layer 13, conventionally known methods can be used and selected according to necessity. Specific examples of the coating methods include: a spin coat method; a dipping method; a casting method; and so on; various kinds of printing methods such as a screen printing method, an ink-jet printing method, an offset printing method, and a gravure printing method; and various kinds of coating methods such as a stamping method, a spray method, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calender coater method.

As the resin layer 13, for example, a UV-curable resin, a thermosetting resin, a thermoplastic resin and so on can be used and selected according to necessity. As a material of the resin layer 13, specifically, for example, a siloxane-based compound, an acryl-based compound, an epoxy-based compound and the like can be cited and can be selected from among these according the necessity.

Next, as shown in FIG. 1C, a first substrate 11, a graphene film 12 and a resin layer 13 are placed on a second substrate 14 so that a resin layer 13 side is a lower side, and the graphene film 12 formed on the first substrate 11 and the second substrate 14 are stuck with the resin layer 13. As the second substrate 14, a desired substrate is used. The second substrate 14 may be a transparent substrate or a non-transparent substrate. Although a material of a transparent substrate is selected according to necessity, for example, a transparent inorganic material such as quartz and glass and a transparent plastic can be cited. As a flexible transparent substrate, a transparent plastic substrate is used. Examples of the transparent plastics include polyethylene terephthalate, polyethylene naphthalate, polycarbonate, polystyrene, polyethylene, polypropylene, polyphenylene sulfide, polyvinylidene fluoride, acetyl cellulose, bromated phenoxy, aramides, polyimides, polystyrenes, polyacrylates, polysulfones, polyolefins and so on. Examples of the non-transparent substrates include a silicon substrate. According to the kind of the resin layer 13, before placing the first substrate 11, the graphene film 12 and the resin layer 13 on the second substrate 14, a surface of the second substrate 14 may be subjected to a hydrophilic treatment.

Next, as shown in FIG. 1D, the first substrate 11 is pressurized against the second substrate 14 to reduce a thickness of the resin layer 13 to a desired thickness. A pressurizing method is not particularly limited. For example, a roll can be used to pressurize or a flat plate can be pressed to pressurize. At this time, pressurization is preferably conducted so that as a thickness decreases, air bubbles contained in the resin layer 13 are removed. When the resin layer 13 has fluidity at room temperature, pressurization can be conducted at room temperature. However, when the fluidity cannot be obtained unless under heating, the pressurization is conducted under heating. A thickness of the resin layer 13 after pressurization is preferably selected to the minimum in the range where the graphene film 12 and the second substrate 14 can be stuck with the resin layer 13 with excellent adhesiveness. The minimum thickness of the resin layer 13 is, for example, 1 μm or more and 3 μm or less.

Then, as shown in FIG. 1E, the first substrate 11 is removed. When the first substrate 11 is removed, etching is preferably used. An etching method is not particularly limited as long as it can remove a metal catalyst that configures the first substrate 11. As an etching method, any of dry etching that uses a vacuum device and wet etching that uses an etchant (an etching liquid) may be used. However, from the viewpoint of etching efficiency, wet etching is preferably used. An etchant used in wet etching is not particularly limited as long as it can dissolve a metal catalyst. When a metal catalyst is configured of copper, for example, when a first substrate 11 is configured of copper, as an etchant, an acid such as phosphoric acid or nitric acid or a redox etchant such as iron nitrate or iron chloride can be used. Preferably, the latter redox etchant is used. This is because when a redox etchant is used, air bubbles are not generated during etching. Accordingly, defect can be prevented from occurring in a graphene film 12 and a metal catalyst can be uniformly dissolved. In order to increase etching speed, an etchant is preferably stirred during etching. As an etching process, electrolytic etching in an aqueous solution of copper sulphate may be used.

After that, a surface of the graphene film 12 exposed by removing the first substrate 11 is cleansed with pure water or the like and dried.

As described above, the graphene film 12 can be transferred from the first substrate 11 to the second substrate 14, and a structure where the graphene film 12 and the second substrate 14 are stuck with the resin layer 13 can be obtained.

As described above, according to the first embodiment, the graphene film 12 and the second substrate 14 are stuck with the resin layer 13, whereby adhesiveness of the graphene film 12 with respect to the second substrate 14 is excellent. Further, a volatile component contained in the resin layer 13 when the graphene film 12 and the second substrate 14 are stuck is such a slight amount as less than 1% by weight. Therefore, in the step after the graphene film 12 and the second substrate 14 have been stuck, a volatile component is hardly volatilized from the resin layer 13, that is, air bubbles are hardly generated. Accordingly, there is hardly a risk of generating defects in the graphene film 12 owing to air bubbles. Further, a volatile component contained in the resin layer 13 is such a slight amount as less than 1% by weight. Therefore, even when the resin layer 13 is coated over a large area, the volatile component can be prevented from generating air bubbles. As a result, a large area graphene film can be obtained. Still further, when the first substrate 11 is removed by etching, since the graphene film 12 is more strongly held by the second substrate 14 via the resin layer 13, defects can be effectively prevented from being generated in the graphene film 12. Further, during etching, when an entirety of the first substrate 11, the graphene film 12, the resin layer 13 and the second substrate 14 is rigorously moved, peel and defects can be prevented from occurring. Therefore, for example, while stirring the etchant, wet etching can be conducted. As a result, an etching speed can be increased and an etching time can be shortened. Further, according to a conventional transferring method, a resin layer is present in some cases above a graphene film formed on a substrate. However, according to the first embodiment, the resin layer 13 is present between the graphene film 12 and the second substrate 14 and is not present on the graphene film 12. Therefore, different from the conventional transferring method, the step of removing the resin layer is unnecessary and the throughput of transfer can be improved.

According to the first embodiment, by using a transparent substrate as the second substrate 14, a transparent conductive film configured of a structure obtained by sticking the graphene film 12 and the second substrate 14 with the resin layer 13 can be obtained. This transparent conductive film can be used for, for example, a display, a touch panel, a dye-sensitized solar battery and so on.

2. Second Embodiment

Method for Transferring Graphene Film

FIGS. 2A to 2E show a method for transferring a graphene film according to the second embodiment.

Figure 2:
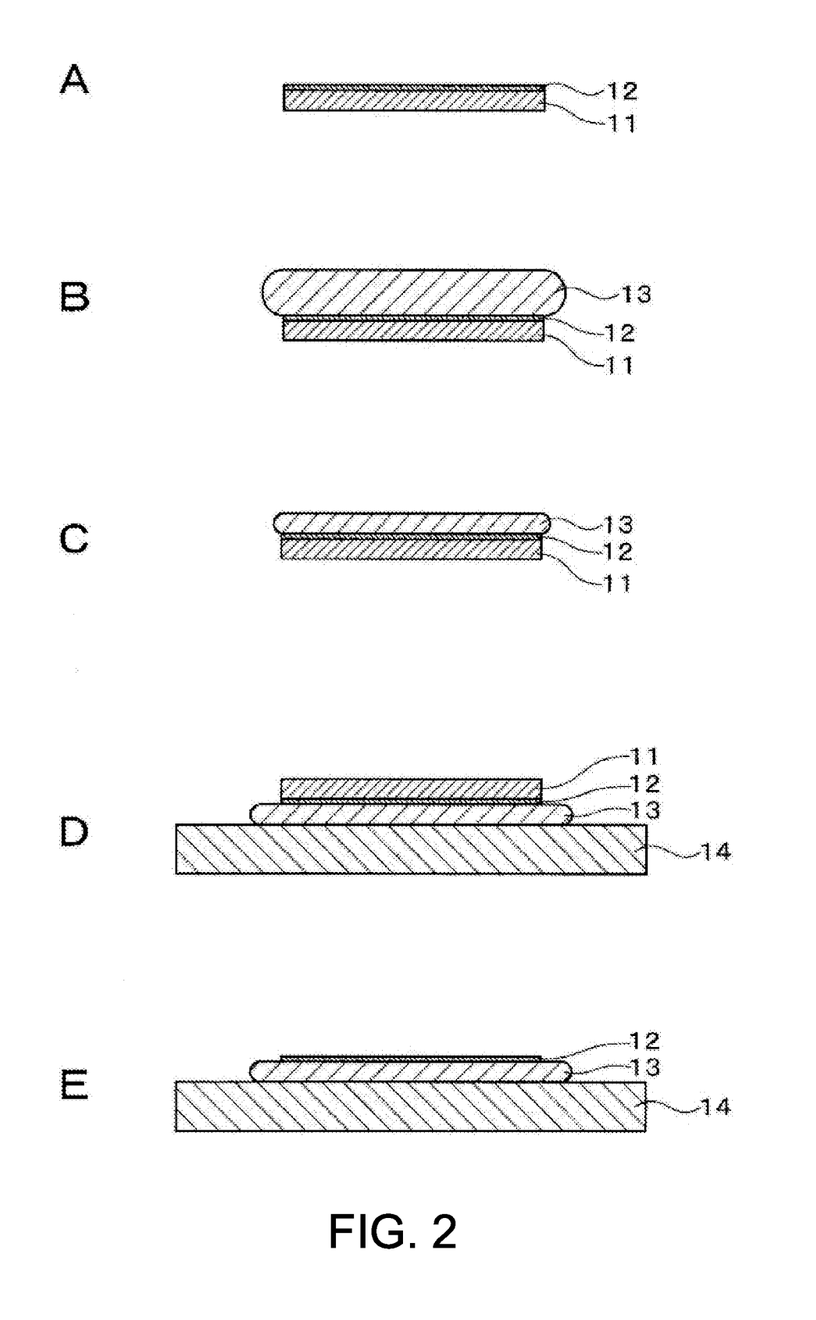
FIG. 2 A cross-sectional view for explaining a method for transferring a graphene film according to a second embodiment of the present invention.

As shown in FIG. 2A, in a manner the same as that of the first embodiment, a graphene film 12 is formed on a first substrate 11.

Next, as shown in FIG. 2B, on the graphene film 12, a resin layer 13 that contains at least 1% by weight or more of a volatile component and has adhesiveness is coated. A material, a thickness, a coating method and so on of the resin layer 13 is the same as those of the first embodiment.

Then, as shown in FIG. 2C, by drying the resin film 13 to volatilize a volatile component, the volatile component is reduced to less than 1% by weight, preferably 0.5% by weight or less, and more preferably 0.1% by weight or less. According to the drying, a thickness of the resin layer 13 is reduced. The resin layer 13 that has adhesiveness after drying and self-deformability is used.

Next, as shown in FIG. 2D, the first substrate 11, the graphene film 12 and the resin layer 13 are placed on a second substrate 14 so that a resin layer 13 side is downward, and the graphene film 12 formed on the first substrate 11 and the second substrate 14 are stuck with the resin layer 13. As the second substrate 14, the same as that of the first embodiment can be used.

Then, as shown in FIG. 2E, in a manner the same as that of the first embodiment, the first substrate 11 is removed.

After that, a surface of the graphene film 12 exposed by removing the first substrate 11 is cleansed with pure water or the like and dried.

As described above, the graphene film 12 can be transferred from the first substrate 11 to the second substrate 14, and a structure where the graphene film 12 and the second substrate 14 are stuck with the resin layer 13 can be obtained.

According to the second embodiment, various advantages the same as those of the first embodiment can be obtained.

Example 1

Example Corresponding to First Embodiment

As a first substrate 11, a copper foil was used.

The copper foil was put in a quartz tubular furnace heated at 1000° C. of a CVD device, hydrogen gas ($H_2$) and methane ($CH_4$) gas were flowed (hydrogen gas flow rate: 8 sccm, methane gas flow rate: 24 sccm, pressure: 0.3 Torr), and a graphene film was synthesized on the copper foil. After synthesis, while flowing again hydrogen gas, a temperature was lowered. Thereafter, the copper foil on which the graphene film was synthesized was taken out of the quartz tubular furnace.

Next, on the graphene film synthesized on the copper foil, an epoxy resin-based UV-curable resin that is liquid at room temperature and contains a solvent that is at least 0.1% by weight or less of a volatile component (EX09-380-1LV3, manufactured by ASEC Co., Ltd.) was spin coated under the condition of 400 rpm for 40 second to form a resin layer. A thickness of the resin layer was about 20 μm.

Next, by using a transparent glass substrate as a second substrate 14, on the glass substrate, the resin layer configured of a UV-curable resin coated on the graphene film synthesized on the copper foil was placed and stuck with a resin layer side thereof held downward.

Then, a flat plate is pressurized from the copper foil, whereby a thickness of the resin layer 13 was reduced to finally a thickness of about 2 μm.

Next, from a rear surface side of the glass substrate, UV rays were irradiated. Thereby, UV rays transmitted through the glass substrate were irradiated on the resin layer to cure. The irradiation condition was set to irradiation power density of 160 W/cm$^2$ and irradiation time of 40 seconds.

Then, an entirety of the glass substrate, the resin layer, the graphene film and the copper foil was dipped in an aqueous solution of 1 M of iron nitrate ($Fe(NO_3)_3$) for 50 minutes to remove the copper foil by etching.

After that, an entirety of the glass substrate, the resin layer and the graphene film was cleansed with ultrapure water and dried.

As described above, a structure where a graphene film and a glass substrate were stuck with a resin layer was formed.

Example 2

Example Corresponding to Second Embodiment

As a first substrate 11, a copper foil was used.

The copper foil was put in a quartz tubular furnace heated at 1000° C. of a CVD device, hydrogen gas ($H_2$) and methane ($CH_4$) gas were flowed (hydrogen gas flow rate: 8 sccm, methane gas flow rate: 24 sccm, pressure: 0.3 Torr), and a graphene film was synthesized on the copper foil. After synthesis, while flowing again hydrogen gas, a temperature was lowered. Thereafter, the copper foil on which the graphene film was synthesized was taken out of the quartz tubular furnace.

A thermoplastic resin (manufactured by Soken Chemical & Engineering Co., Ltd., SK Dyne 2300 ("SK Dyne" is a registered trade mark)) and a curing agent (manufactured by Soken Chemical & Engineering Co., Ltd., L-45) were mixed at a weight ratio of 100:5, and the mixture was added in propylene glycol monomethyl ether acetate (PEGMEA) so that a concentration of SK Dyne 2300 that is a main component is 50% by weight and dissolved, thus a solution of SK Dyne 2300 was prepared. The solution of SK Dyne 2300 was, after drop casting on the graphene film formed on the copper foil, dried at room temperature to form a resin layer, and a content of a volatile component in the resin layer was reduced to less than 1% by weight. A thickness of the resin layer was about 20 μm.

Next, a transparent glass substrate was used as the second substrate 14, on the glass substrate, a resin layer configured of a thermoplastic resin coated on the graphene film that was synthesized on the copper foil was placed and stuck with a resin layer side thereof held downward.

Next, by heating at 150° C. for 3 minutes, the resin layer was melted and the graphene film and the glass substrate were completely stuck together.

After leaving to cool, an entirety of the glass substrate, the resin layer, the graphene film and the copper foil was dipped in an aqueous solution of 1 M of iron nitrate for 50 minutes to remove the copper foil by etching.

After that, an entirety of the glass substrate, the resin layer and the graphene film was cleansed with ultrapure water and dried.

As described above, a structure where a graphene film and a glass substrate were stuck with a resin layer was formed.

Comparative Example 1

In a manner the same as that of Example 1, a graphene film was synthesized on a copper foil, and the copper foil was taken out of a quartz tubular furnace.

Polyvinyl phenol (PVP) that is a thermosetting resin and melamine that is a cross-linking agent were mixed at a weight ratio of 10:1, and the mixture was added in propylene glycol monomethyl ether acetate (PEGMEA) and dissolved therein so that a PVP concentration was 10% by weight, thus a PVP solution was prepared. The PVP solution was spin coated on the graphene film synthesized on the copper foil under the condition of 3000 rpm and 30 seconds to form a resin layer configured of a PVP-based thermosetting resin. The resin layer contains at least several percent or more of volatile components. A thickness of the resin layer was about 20 μm.

On the glass substrate, a resin layer configured of a PVP-based thermosetting resin coated on the graphene film synthesized on the copper foil was placed and stuck with a resin layer side thereof held downward.

Next, by baking at 180° C. for 20 minutes, the resin layer configured of a PVP-based thermosetting resin was cured.

Then, an entirety of the glass substrate, the resin layer, the graphene film and the copper foil was dipped in an aqueous solution of 1 M of iron nitrate for 50 minutes to remove the copper foil by etching.

After that, an entirety of the glass substrate, the resin layer and the graphene film was cleansed with ultrapure water and dried.

As described above, a structure where a graphene film and a glass substrate were stuck with a resin layer was formed.

Comparative Example 2

In a manner the same as that of Example 1, a graphene film was synthesized on a copper foil, and the copper foil was taken out of a quartz tubular furnace.

A thermoplastic resin was dissolved in ethyl acetate so that a content thereof was 30% by weight. The thermoplastic resin solution was spin coated on the graphene film synthesized on the copper foil under the condition of 4000 rpm and 30 seconds to form a resin layer configured of a thermoplastic resin. The resin layer contains at least several percent or more of volatile components. A thickness of the resin layer was about 20 μm.

On the glass substrate, a resin layer configured of a thermoplastic resin coated on the graphene film synthesized on the copper foil was placed and stuck with a resin layer side held downward.

Next, by baking at 150° C. for 5 minutes, the resin layer configured of a thermoplastic resin was cured.

Then, an entirety of the glass substrate, the resin layer, the graphene film and the copper foil was dipped in an aqueous solution of 1 M of iron nitrate for 50 minutes to remove the copper foil by etching.

After that, an entirety of the glass substrate, the resin layer and the graphene film was cleansed with ultrapure water and dried.

In a manner what was described above, a structure where a graphene film and a glass substrate were stuck with a resin layer was formed.

[Characteristics Evaluation of Graphene Film]

An in-plane distribution of sheet resistance was measured of each of graphene films of Examples 1, 2 and Comparative Examples 1, 2. Results thereof are shown in FIG. 3.

Figure 3:
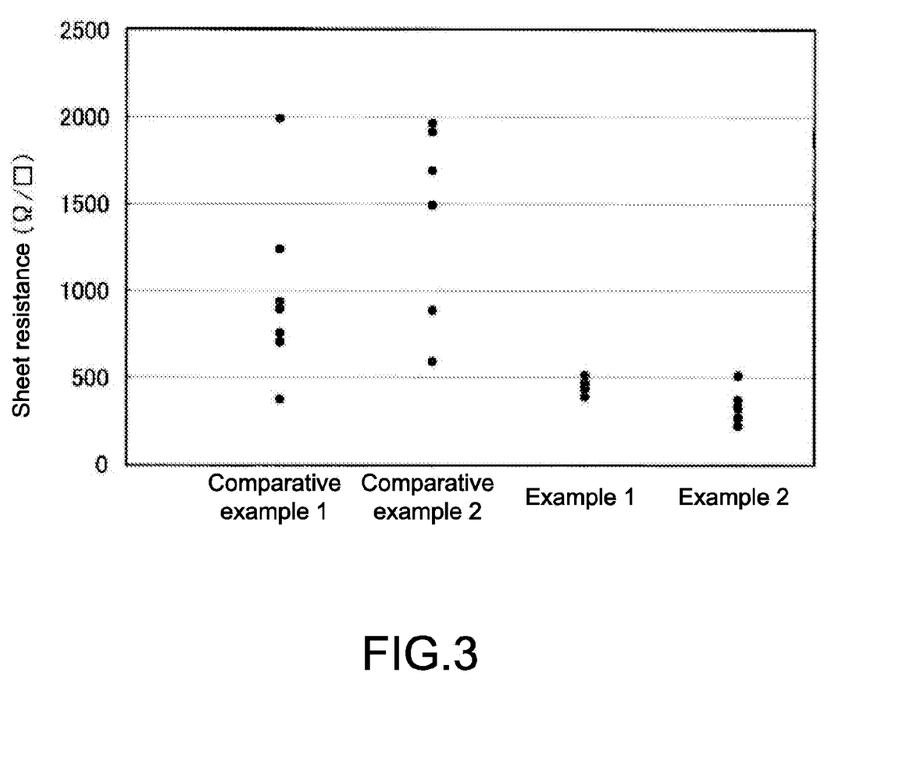
FIG. 3 An outlined line drawing showing experimental results of Examples 1 and 2 and Comparative Examples 1 and 2.

As shown in FIG. 3, it is found that, while graphene films of Comparative Examples 1, 2 have large sheet resistance and large in-plane distributions thereof, graphene films of Examples 1, 2 have small sheet resistance and small in-plane distribution thereof, and are graphene films having excellent characteristics. Further, as a result of optical microscope observation, while fine voids generated owing to air bubbles were observed in graphene films of Comparative Examples 1, 2, in graphene films of Examples 1, 2, such the voids were not observed.

Hereinabove, embodiments and examples of the present invention were specifically described. However, the present invention, without limiting to the above-described embodiments and examples, can be variously modified based on technical ideas of the present invention.

For example, numerical values, structures, processes, shapes, materials and so on cited in the embodiments and examples are only examples, and, as required, different numerical values, structures, processes, shapes, materials and so on may be used.

DESCRIPTION OF SYMBOLS 11 first substrate,
12 graphene film,
13 resin layer,
14 second substrate

The invention claimed is:

1. A method for transferring a graphene film comprising the steps of:
sticking one layer or a plurality of layers of graphene films formed on a first substrate and a second substrate with a resin layer that contains less than 1% by weight of a volatile component and has adhesiveness; and
removing the first substrate.

2. The method for transferring a graphene film according to claim 1, wherein a content of the volatile component of the resin layer is 0.1% by weight or less.

3. The method for transferring a graphene film according to claim 2, further comprising the step of:
after sticking the graphene film formed on the first substrate and the second substrate with the resin layer and before removing the first substrate, pressurizing the first substrate and the second substrate to reduce a thickness of the resin layer.

4. The method for transferring a graphene film according to claim 3, further comprising the step of:
after pressurizing the first substrate and the second substrate to reduce a thickness of the resin layer and before removing the first substrate, curing the resin layer.

5. The method for transferring a graphene film according to claim 4, wherein the resin layer is configured of a UV-curable resin, a thermosetting resin or a thermoplastic resin.

6. The method for transferring a graphene film according to claim 1, wherein on the graphene film formed on the first substrate, the resin layer is coated.

7. The method for transferring a graphene film according to claim 1, wherein, after coating a resin layer that contains at least 1% by weight or more of a volatile component on the graphene film formed on the first substrate, the resin layer is dried to remove a volatile component to form the resin layer that contains less than 1% by weight of a volatile component and has adhesiveness.

8. The method for transferring a graphene film according to claim 1, wherein a thickness of the resin layer is 2 μm or more and 20 μm or less.

9. The method for transferring a graphene film according to claim 1, wherein the second substrate is a transparent substrate.

10. A method for manufacturing a transparent conductive film comprising the steps of:
sticking one layer or a plurality of layers of graphene films formed on a first substrate and a second substrate with a resin layer that contains less than 1% by weight of a volatile component and has adhesiveness; and
removing the first substrate.

11. The method for manufacturing a transparent conductive film according to claim 10, wherein a content of the volatile component of the resin layer is 0.1% by weight or less.

12. The method for manufacturing a transparent conductive film according to claim 11, further comprising the step of:
after sticking the graphene film formed on the first substrate and the second substrate with the resin layer and before removing the first substrate, pressurizing the first substrate and the second substrate to reduce a thickness of the resin layer.

13. The method for manufacturing a transparent conductive film according to claim 12, further comprising the step of:
after pressurizing the first substrate and the second substrate to reduce a thickness of the resin layer and before removing the first substrate, curing the resin layer.

14. The method for manufacturing a transparent conductive film according to claim 13, wherein the resin layer is configured of a UV-curable resin, a thermosetting resin or a thermoplastic resin.

15. The method for manufacturing a transparent conductive film according to claim 11, wherein on the graphene film formed on the first substrate, the resin layer is coated.

16. The method for manufacturing a transparent conductive film according to claim 10, wherein, after coating the resin layer that contains at least 1% by weight or more of the volatile component on the graphene film formed on the first substrate, the resin layer is dried to remove the volatile component to form the resin layer that contains less than 1% by weight of the volatile component and has adhesiveness.

17. The method for manufacturing a transparent conductive film according to claim 10, wherein a thickness of the resin layer is 2 μm or more and 20 μm or less.

18. The method for manufacturing a transparent conductive film according to claim 10, wherein the second substrate is a transparent substrate.

* * * * *